(12) United States Patent
Zahlmann et al.

(10) Patent No.: US 9,691,560 B2
(45) Date of Patent: Jun. 27, 2017

(54) SINGLE- OR MULTI-POLE SWITCHING DEVICE, IN PARTICULAR FOR DC APPLICATIONS

(75) Inventors: Peter Zahlmann, Neumarkt (DE); Stefanie Schreiter, Neumarkt (DE); Arnd Ehrhardt, Neumarkt (DE); Michael Rock, Königsee (DE)

(73) Assignee: DEHN + SÖHNE GmbH + Co. KG, Neumarkt/Opf. (DE)

(*) Notice: Subject to any disclaimer, the term of this patent is extended or adjusted under 35 U.S.C. 154(b) by 364 days.

(21) Appl. No.: 14/005,582

(22) PCT Filed: Mar. 16, 2012

(86) PCT No.: PCT/EP2012/054705
§ 371 (c)(1),
(2), (4) Date: Nov. 20, 2013

(87) PCT Pub. No.: WO2012/126850
PCT Pub. Date: Sep. 27, 2012

(65) Prior Publication Data
US 2014/0110376 A1 Apr. 24, 2014

(30) Foreign Application Priority Data

Mar. 22, 2011 (DE) .......... 10 2011 014 696
Nov. 16, 2011 (DE) .......... 10 2011 118 713

(51) Int. Cl.
*H01H 1/36* (2006.01)
*H01H 1/20* (2006.01)
(Continued)

(52) U.S. Cl.
CPC .......... *H01H 1/365* (2013.01); *H01H 1/2041* (2013.01); *H01H 3/00* (2013.01);
(Continued)

(58) Field of Classification Search
CPC .... H01H 1/2041; H01H 33/596; H01H 19/56; H01H 1/365; H01H 3/00; H01H 9/302
(Continued)

(56) References Cited

U.S. PATENT DOCUMENTS

| 2,732,463 A | 1/1956 | Steinmayer ................. 218/13 |
| 5,004,874 A * | 4/1991 | Theisen ................. H01H 1/20 218/151 |

(Continued)

FOREIGN PATENT DOCUMENTS

| DE | 594 755 | 3/1934 | ............ H01H 9/40 |
| DE | 640 498 | 1/1937 | ............ H01H 19/56 |

(Continued)

OTHER PUBLICATIONS

The International Search Report (in English) dated Sep. 27, 2012, the Written Opinion of the International Searching Authority (in English), dated Sep. 22, 2013 and the International Report on Patentability (in English) and dated Sep. 24, 2013 issued by the World Intellectual Property Organization (WIPO) for Applicants' corresponding PCT Application No. PCT/EP2012/054705, filed on Mar. 16, 2012.

*Primary Examiner* — Renee Luebke
*Assistant Examiner* — William Bolton
(74) *Attorney, Agent, or Firm* — Bodner & O'Rourke, LLP; Gerald T. Bodner; Christian P. Bodner

(57) ABSTRACT

The invention relates to a single- or multi-pole switching device, in particular for DC applications, having at least one rotating switching element (2) which is connected to a drive, and also comprising switching contacts (4, 5), connection pieces (7) and connection poles or connection terminals (8) and a housing arrangement which accommodates the above-mentioned parts. According to the invention, a movably guided rotary cylinder (2) is formed in the housing arrangement, said rotary cylinder being located in a body which is (Continued)

designed as a rotary cylinder holder (1). The rotary cylinder (2) has at least one contact pin (3) which passes radially or tangentially or eccentrically through the rotary cylinder and has, at its end, a contact piece (4) in each case. Mating contact pieces (5) are arranged in the rotary cylinder holder (1), said mating contact pieces being electrically connected to the connection pieces (7) or connection poles or connection terminals (8). A narrow, arc-influencing gap is present between the rotary cylinder (2) and the rotary cylinder holder (1), wherein, as a result of the movement of the rotary cylinder (2), the electrical connection between the contact pieces (4) and the mating contact pieces (5) can be broken by way of the contact pin (3) and the resulting disconnection arcs (11) enter the air gap subject to an extension and are rapidly extinguished there.

14 Claims, 9 Drawing Sheets

(51) Int. Cl.

| | | |
|---|---|---|
| *H01H 19/56* | (2006.01) | |
| *H01H 33/59* | (2006.01) | |
| *H01H 3/00* | (2006.01) | |
| *H01H 9/30* | (2006.01) | |
| *H01H 9/32* | (2006.01) | |
| *H01H 9/54* | (2006.01) | |
| *H01H 33/06* | (2006.01) | |
| *H01L 31/02* | (2006.01) | |

(52) U.S. Cl.
CPC ........... *H01H 19/56* (2013.01); *H01H 33/596* (2013.01); *H01L 31/02021* (2013.01); *H01H 9/302* (2013.01); *H01H 9/32* (2013.01); *H01H 9/542* (2013.01); *H01H 33/06* (2013.01); *H01H 2009/543* (2013.01); *Y02E 10/50* (2013.01)

(58) Field of Classification Search
USPC .... 218/4, 7, 9, 13, 14, 20, 152–155, 2, 5, 6, 218/113
See application file for complete search history.

(56) References Cited

U.S. PATENT DOCUMENTS

| | | | |
|---|---|---|---|
| 5,126,517 A | 6/1992 | Torres-Isea et al. | 200/151 |
| 8,742,278 B2 * | 6/2014 | Domejean | H01H 9/40 218/149 |
| 2009/0179011 A1 | 7/2009 | Asokan et al. | 218/157 |
| 2010/0126966 A1 | 5/2010 | Domejean et al. | 218/149 |

FOREIGN PATENT DOCUMENTS

| | | | |
|---|---|---|---|
| DE | 699 835 | 12/1940 | ............. H01H 19/56 |
| EP | 1 267 373 | 12/2002 | ............. H01H 19/56 |
| EP | 2 107 581 | 10/2009 | ............. H01H 19/64 |

* cited by examiner

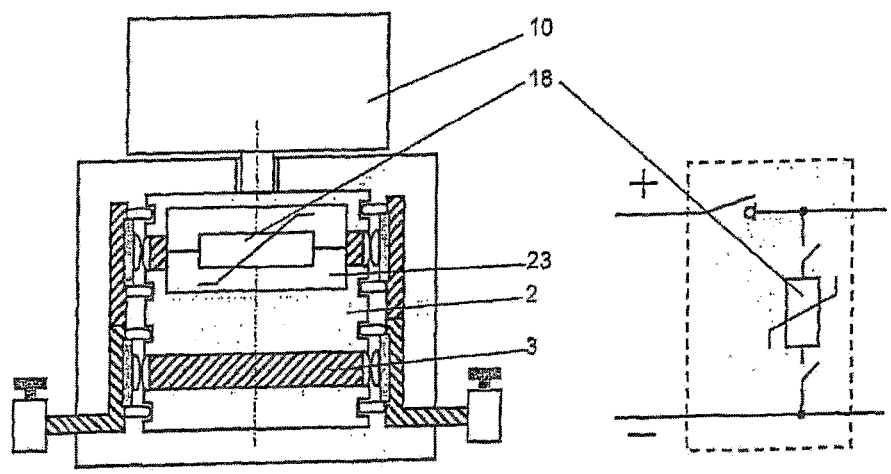
Fig. 16
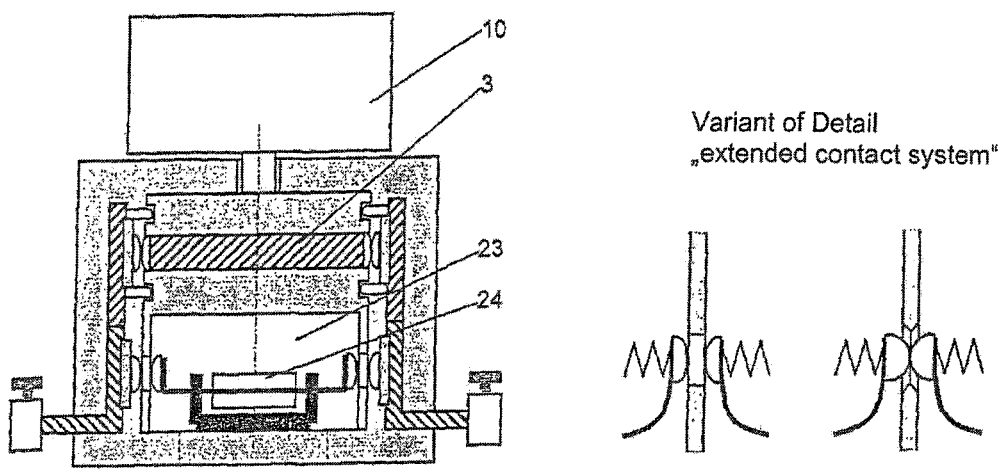
Fig. 17
Variant of Detail „extended contact system"
Fig. 18

SINGLE- OR MULTI-POLE SWITCHING DEVICE, IN PARTICULAR FOR DC APPLICATIONS

The invention relates to a single- or multi-pole switching device, in particular for direct current applications, comprising at least one rotating switching element which is connected to a drive, and also comprising switching contacts, connection pieces and connection poles or connection terminals as well as a housing arrangement receiving the aforementioned parts, according to the preamble of claim 1.

Multiple interruption switches or switching devices are known, for instance, from DE 594 755 A or EP 2 107 581 A1.

The switching device described in EP 2 107 581 A1 includes a rotating switching element which is located inside a housing arrangement. The housing arrangement furthermore receives one rotatably movable and one stationary contact, respectively corresponding contact pairs. A drive, which may be configured as a hand knob, is used to perform the rotary motion for triggering the switching operations, with the switching contacts not only making a rotatory movement relative to one another, but with the action of additional spring forces to increase the contact pressure in the closed position.

To allow the switching off especially of small and medium currents in switching apparatus by means of arc extinguishing chambers known switching apparatus are equipped with supportive devices in the form of permanent magnets for the magnetic blowing. In this respect reference is made, for instance, to US 2010/0126966A.

The constant magnetic field of these magnets is used to effect and accelerate the entering of the break arcs into the sheet metal arc extinguishing chambers. However, the action of the magnets has to be matched with the direction of the current to be interrupted, i.e. the polarity of the switching apparatus has to be kept in mind when installing it in the electric circuit. This restricts the degrees of freedom during the installation, or the mechanic has to be provided with additional information about the exact installation of the switching apparatus. Known switching apparatus of the above-described configuration are limited to nominal currents of some 10 A, with a nominal voltage of approximately 1000 V.

Further known are multiple interruptions using the sum of the anode-cathode voltage drops for building up a sufficiently high arc voltage. This principle is disclosed in DE 594 755 A. Modifications are found in prior art solutions, for instance according to WO 2009/121744 A or the above-mentioned EP 2 107 581 A1. Known switching apparatus of this type work with a plurality of interruption points, which are simultaneously disconnected for a switching off operation.

Frequently, present configurations of AC, respectively three-phase current switching apparatus are upgraded for the switching to DC current applications, specifically also for photovoltaic applications. However, this presents the problems described below.

In solar generators there is usually no flow of high short-circuit currents. Rather those short-circuit currents are to be controlled that are slightly higher than the nominal operating currents. Depending on the kind of insolation the operating current varies in a great range from a few percent of the nominal operating current up to the nominal operating current. The nominal operating current moreover depends on the design of the plant and the intended location, e.g. a string line or a DC main line in the plant, and is typically within the range of 10 A to 100 A, in large-scale plants perhaps even above that range. The above means that a switching apparatus in the DC circuit of a photovoltaic system need not switch short-circuit currents as are known in AC networks, but relatively low currents are switched. This is essential because the extinguishing mechanisms in known switching apparatus for high currents are oriented towards this case of application, while the extinction of lower current switch arcs is more difficult.

Solar generators represent low inductance DC circuits with a small time constant, in which no high overvoltages are produced during the switching off. This character is also due to the high self-capacitance of solar power plants, which may be above 1 mF in large-scale plants depending on the solar modules used. These high self-capacitances may also cause short ohmic-capacitive discharges, e.g. in the event of a short circuit.

Further demands on switching apparatus for the DC circuit of a photovoltaic system are described below. The carrying capacity for pulsed currents with high specific energy values, i.e. $I^2t$-values, which result from a possible discharge of capacitors in DC-AC inverters or from the impact of a lightning on the exposed photovoltaic system, is necessary. The switching apparatus to be created has to reliably carry these short-time pulsed currents with amplitudes that amount to a multiple of the nominal operating current, without opening. It is necessary that the dynamic and thermal impacts of the pulsed currents are controllable without the occurrence of a damage, respectively an impermissible change of the characteristics in the switching apparatus.

In addition, high open-circuit voltages of the solar generator have to be kept in mind, which occur across isolating gaps and already appear even with moderate or little sunlight. This requires a high electric strength upon the blow-out of the arc in the switching apparatus upon switching off, and a sufficient resistance to tracking for high direct voltages. Hence, due to the use in the outdoor area, large isolating gaps are necessary.

On the other hand, switching in the DC circuit of a photovoltaic system is only necessary if maintenance measures, repair measures or expansion measures are to be carried out, or in the event of a failure or fire. Hence, a switching apparatus may be designed for a few switching operations.

Based on the foregoing it is the object of the invention to provide a compact switching device on the basis of a single- or multi-pole switching arrangement, which comprises at least one rotating switching element connected to a drive. The switching device is to be optimized directly for photovoltaic DC circuits and, at the same time, configured for the characteristic features of the switching and of the operation of photovoltaic DC circuits. The switching device has to realize a fast rotary motion to obtain a double interruption with an efficient arc extinction, and control a great range of electric voltage and electric currents corresponding to the parameters of the photovoltaic system in the open state, during the switching and in the closed state. In addition, a possibility is to be provided to ensure not only an interruption of the DC circuit, but additionally also provide for a targeted short circuit. That is, the switching device should be capable of performing the interruption and short-circuiting successively. In the end, the switching device has to have positive properties for the operation of the photovoltaic system, namely a small power dissipation in the continuous operation and a high surge current carrying capacity. It should here be kept in mind that the surge current carrying capacity is necessary in connection with lightning protection and overvoltage protection measures, where great surge currents caused by arresting processes flow via the switching device. The measures according to the invention are to allow the transfer of the switching device into a safe state prior to reaching the end of its service life. Also, a possibility is to be provided to integrate additional functions in the switching device, e.g. an overvoltage or overcurrent protection, without increasing the external installation space.

The solution to the object of the invention is achieved by a single- or multi-pole switching device according to the combination of the features defined in patent claim 1. The dependent claims describe at least useful embodiments and further developments.

Accordingly, there is proposed a single- or multi-pole switching device, in particular for direct current applications, comprising at least one rotating switching element which is connected to a drive. Furthermore, switching contacts, connection pieces and connection poles or connection terminals are to be provided, wherein these aforementioned parts are received in a housing arrangement.

According to the invention a movably guided rotary cylinder is formed in the housing arrangement, which is located in a body designed as a rotary cylinder receptacle.

In this design, the body designed as rotary cylinder receptacle may be part of the housing, respectively housing arrangement.

The rotary cylinder comprises at least one contact pin which preferably passes radially or also tangentially through the rotary cylinder and has a contact piece at each end. The contact pin is designed to be capable of carrying a current and fixed in the rotary cylinder. As an alternative to the pin also elements of different designs and capable of carrying a current may be used.

Mating contacts are arranged in the rotary cylinder receptacle, which are electrically connected to the connection pieces or connection poles, respectively connection terminals.

A narrow, arc-influencing air gap is present between the rotary cylinder and the rotary cylinder receptacle. This air gap may have a gap width of smaller than 200 μm, preferably between approximately 50 μm to 100 μm.

The electrical connection between the contact pieces and the mating contact pieces can be canceled upon the motion of the rotary cylinder with the contact pin. The break arcs occurring at both contact points, which are subject to an extension, penetrate into the air gap and are rapidly extinguished there. In other words, the occurring break arcs are very rapidly transferred into the narrow gap or are formed in this gap, respectively. Thus, the switching off process can be carried out very rapidly and with little energy transformation.

According to the invention the length of the contact pin, including the contact pieces located or formed there, is smaller than or equal to the outer diameter of the rotary cylinder. This means that the contact pieces of the contact pin do not project over the outer surface of the rotary cylinder.

At least parts of the surface sections of the rotary cylinder and/or the rotary cylinder receptacle are made, in the area pointing to the air gap, of a material emitting an extinction gas, in particular POM.

The mating contact pieces are subjected to a preload in the direction of the rotary cylinder and contact the corresponding contact pieces in the closed state of the switching device. The preload may be realized by means of a leaf spring or similar means. The preload results in a corresponding contact force with a contact resistance.

In one embodiment of the invention at least one tracing element, e.g. designed as a tracing nose, is provided in the area of the mating contact pieces, which bears against the outer surface of the rotary cylinder and lifts off the mating contact pieces upon a rotary motion in the opening direction of the switching device, wherein the tracing element(s) immerse(s) into a corresponding recess or cavity in the rotary cylinder in the closed position of the switching device.

The sides of the contact pieces and mating contact pieces pointing to each other have the shape of a hemisphere, a mushroom head or a similar rounded shape.

In one embodiment of the invention a blocking element is provided between the rotary cylinder and the rotary cylinder receptacle, which is located in a guide whose opening is cleared when the material sealing the opening begins to wear, wherein the blocking element then engages with a complementary recess so as to suppress new switching operations. The blocking element should basically be released in the opening process, whereby then the complete blocking in the Off-state of the switching device is obtained. The releasing of the blocking element may be connected to a visual display or a remote signaling means.

In a one-level or a two-level arrangement, after an opening operation of the switching device by means of the first or a second contact pin, a short-circuit function can be released. To this end, additional mating contact pieces are arranged in the rotary cylinder receptacle, which are connected to additional connection pieces or connection pins, respectively connection terminals.

According to an embodiment the contact pin for the opening and closing is located in the rotary cylinder in a first level and the contact pin for the short-circuiting is located in the rotary cylinder in a second level, wherein the contact pins are arranged offset relative to each other at an angle. The short-circuiting is accordingly carried out with a time offset after the disconnection, respectively opening process of the switching device. This time offset is guaranteed by the mechanical arrangement of the rotary motion and the fast extinction of the arcs in the opening process. The time offset is essential insofar as a high-current discharge of input capacitors of a DC-AC inverter of solar systems via the break arcs during the opening process is avoidable.

The burn-off contacts in the rotary switching device can advantageously be arranged such that the break arcs are located in a narrow insulating material gap immediately after their occurrence.

Preferably, the short-circuit contact pin may have a predefined active resistance.

In one embodiment of the invention the switching device may comprise burn-off contacts adjacent to the mating contact pieces and/or the contact pieces.

The current supply to the mating contact pieces can be accomplished through the connection pieces, using the Lorentz force in pulsed current flows such that the contact force between the contact piece and the mating contact piece is increased upon a corresponding current flow.

In a further development of the invention offsets or recesses are provided in the surfaces of the rotary cylinder and the rotary cylinder receptacle pointing to each other, which increase the creepage distances and, depending on the rotational position, define open or virtually closed air gaps.

According to another embodiment the rotary cylinder may comprise cavities for receiving additional switching elements, such as fuses, overvoltage-limiting semiconductors or similar components.

Additional contact pieces and mating contact pieces are provided to electrically connect the components located inside the cavities.

Moreover, according to the invention, a contact arrangement is provided, which comprises a pair of rotationally movable contact pieces and a pair of stationary mating contact pieces. The surfaces of the contact pieces and mating contact pieces pointing to each other have the shape of a hemisphere, a mushroom head or a similar rounded shape. Upon a relative motion by pivoting or rotating the surface sections which touch each other centrally lose contact and arcs are formed between the edges moving apart from each other, which are drawn into an annular gap that is produced by geometry and motion between the contact piece and the mating contact piece.

The invention will be explained in more detail below by means of embodiments and with the aid of figures.

Figure 3:
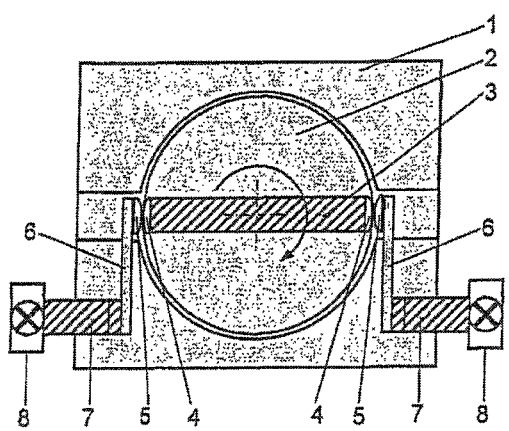
FIG. 3 shows a cross-section of the first embodiment of the switching device according to the invention.
Figure 4:
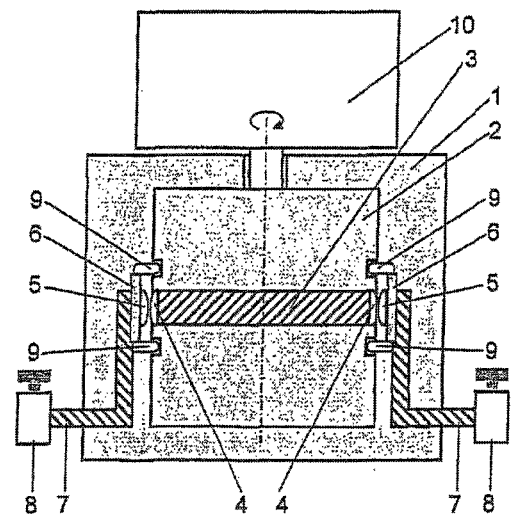
Figure 5:
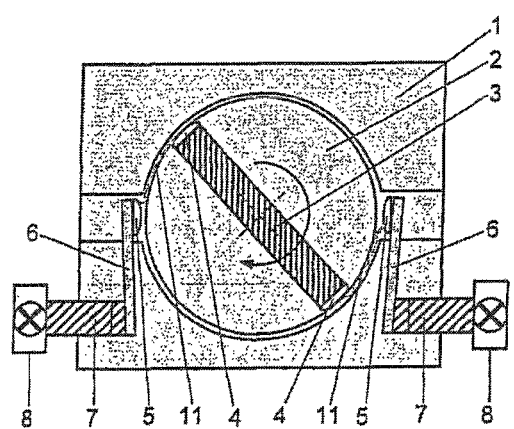
Figure 6:
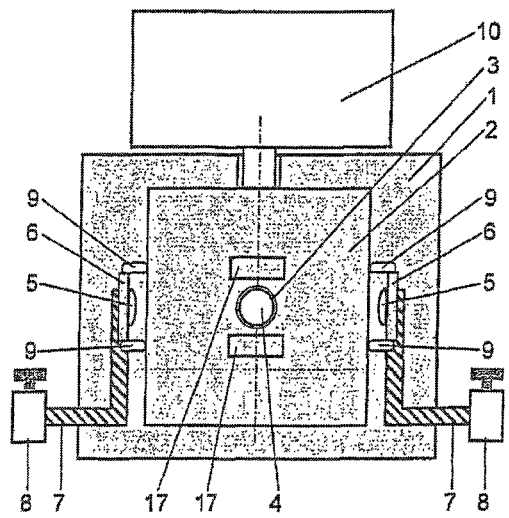
Figure 7:
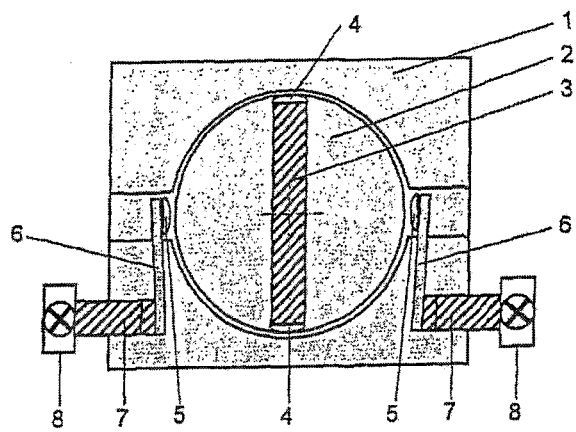
Figure 8A:
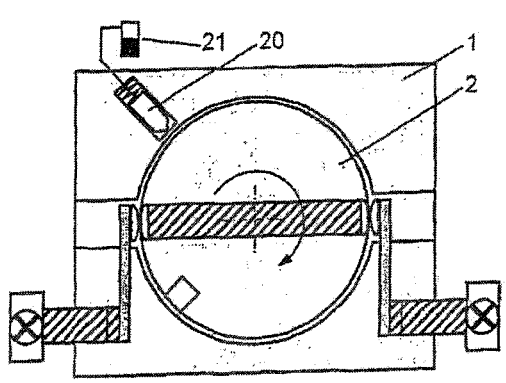
Figure 8B:
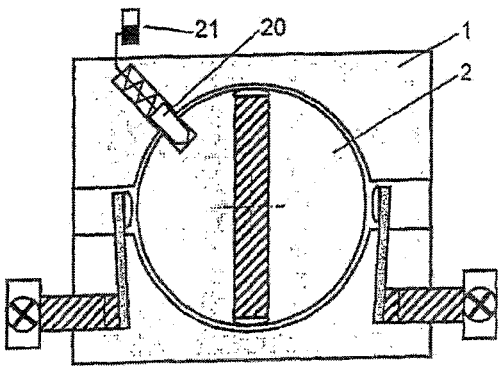
Figure 9:
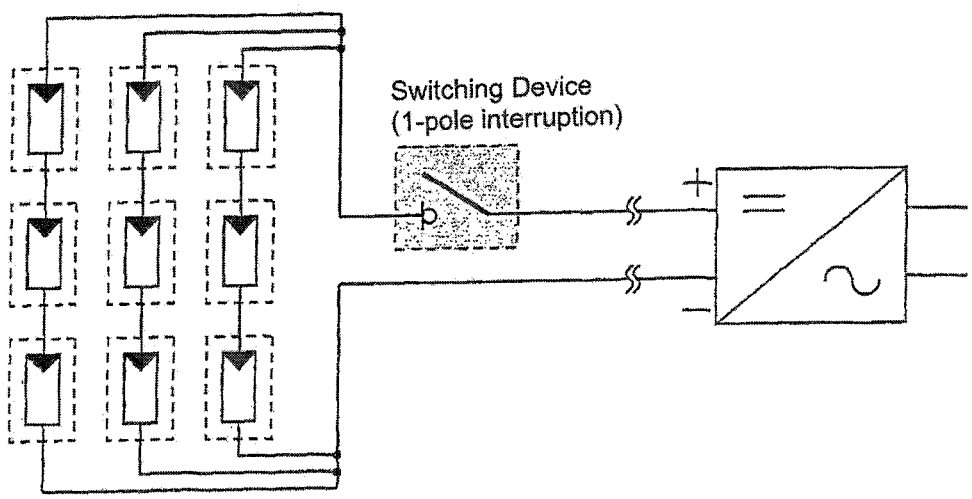
Figure 10:
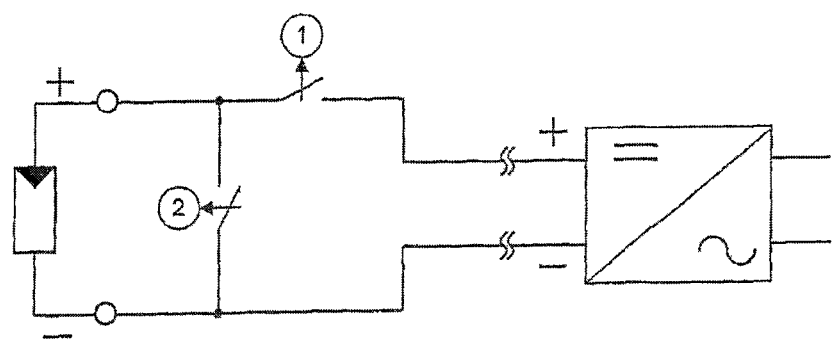
Figure 11:
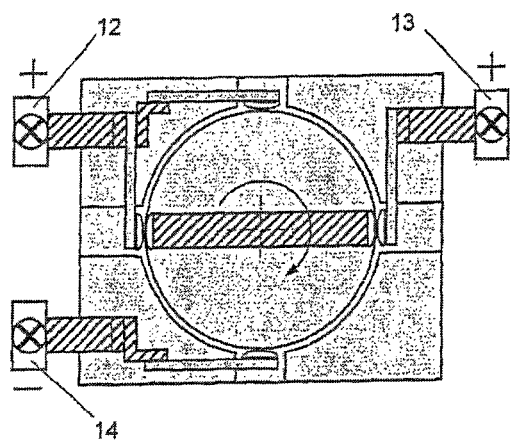
Figure 12:
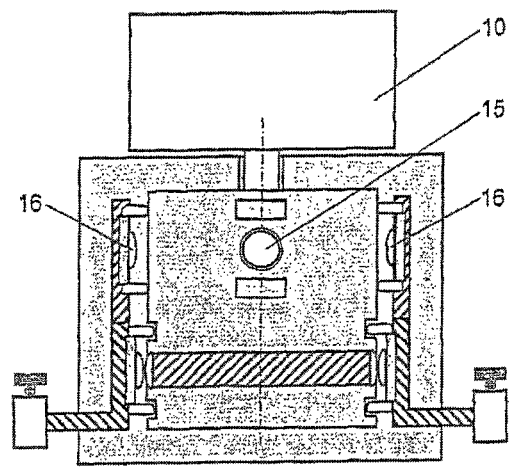
Figure 13:
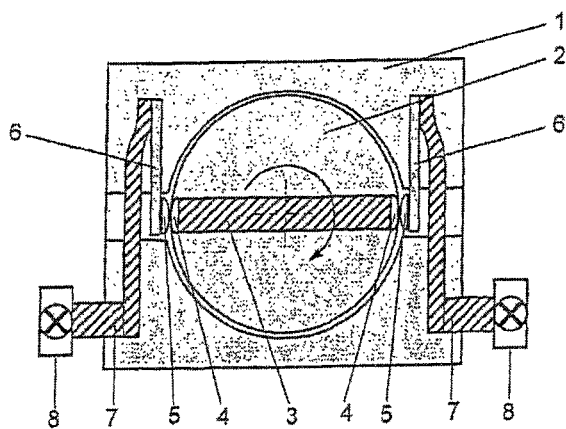
Figure 14:
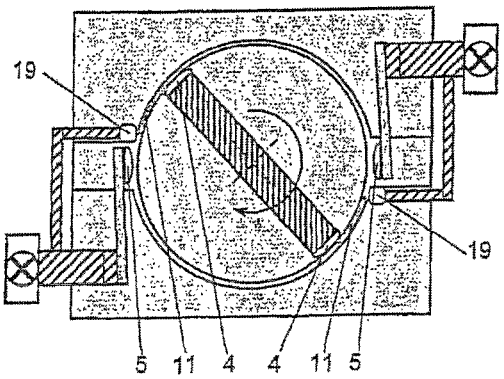
Figure 15:
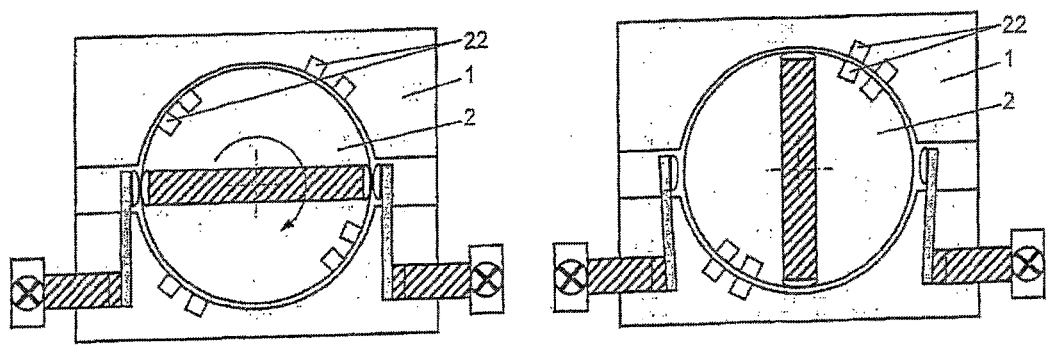
Figure 19:
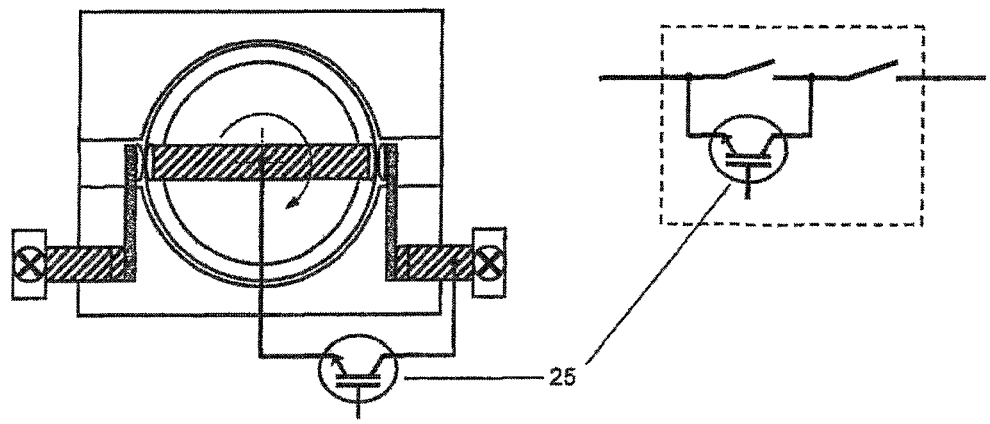
Figure 20:
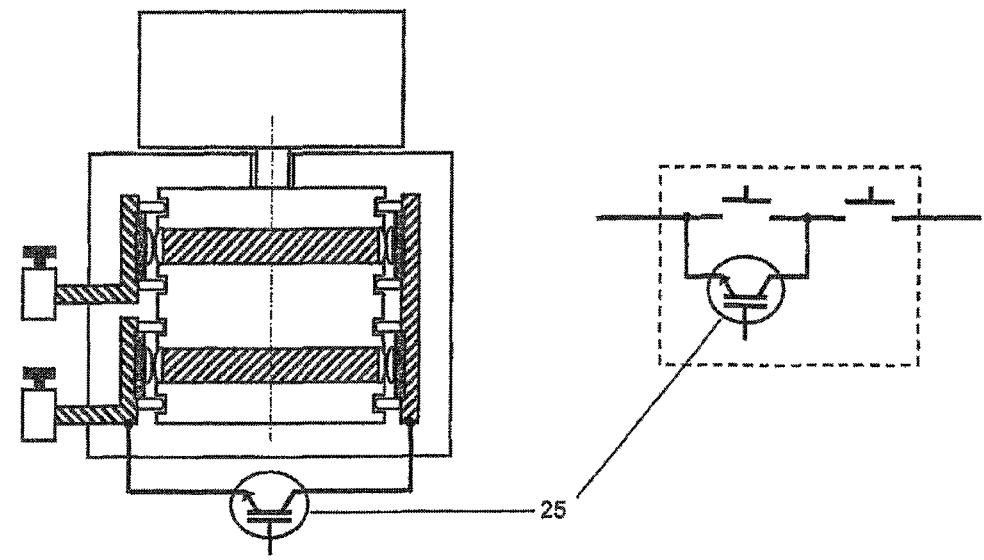
Figure 21:
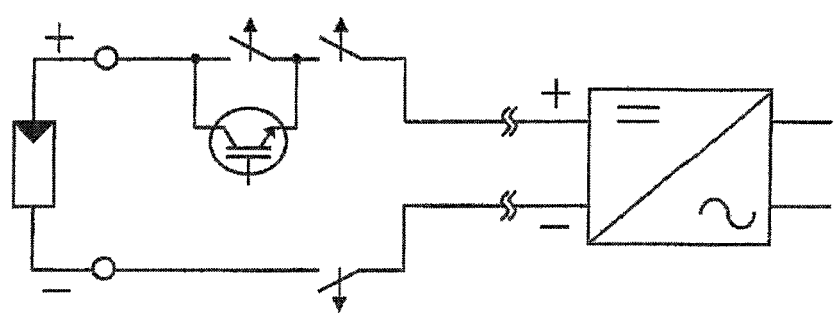
Figure 22:
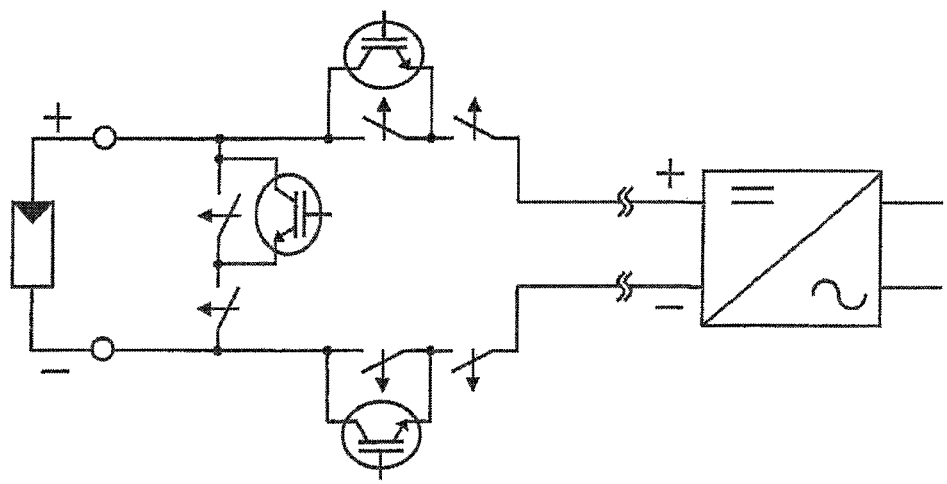
Figure 23:
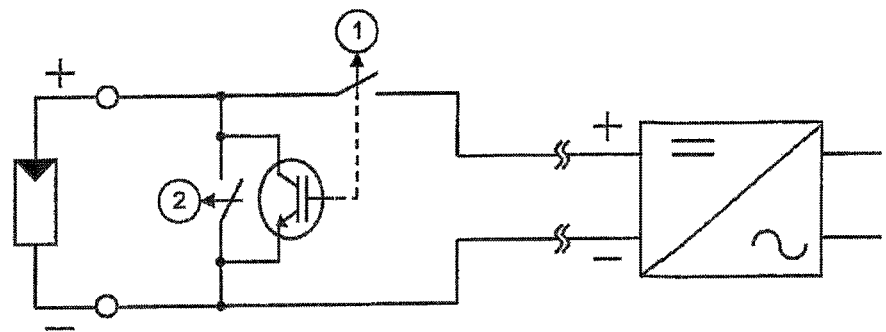
Figure 24:
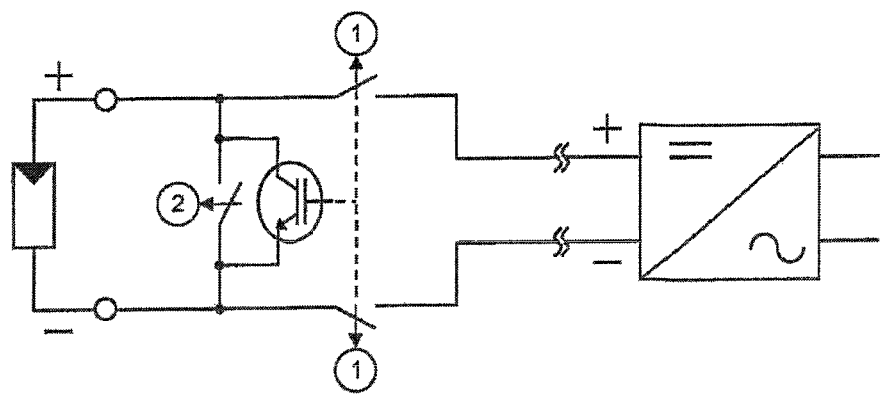
Figure 25:
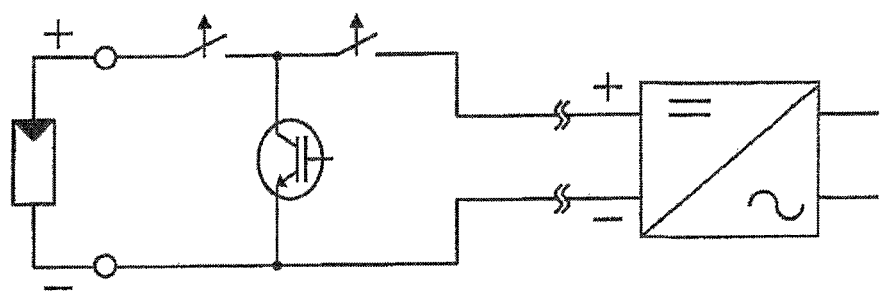

FIG. 4 a longitudinal section of the first embodiment of the switching device according to the invention;

FIG. 5 shows an illustration similar to that of FIG. 3, but with an initiated switching off operation by performing a rotary motion;

FIG. 6 shows an illustration of the switching device similar to that of FIG. 4, but in the switched off state;

FIG. 7 shows an illustration similar to that of FIG. 5 of a switching device in the cross-section in the switched off state;

FIGS. 8a and 8b show a cross-sectional illustration of a switching device, FIG. 8a depicting the closed switching state and FIG. 8b depicting the opened switching state with a released blocking element;

FIG. 9 shows a block diagram of a photovoltaic system including an inserted single-pole switching device according to the invention in the DC current branch downstream of the solar generator and upstream of the DC-AC inverter;

FIG. 10 shows a block diagram with the arrangement of a switching device 1 as opening and closing devices as well as a short-circuiting device 2;

FIG. 11 shows a cross-section of an embodiment of the switching device according to the invention as a switch and short-circuiting device in one level;

FIG. 12 shows a longitudinal section of an embodiment of the switching device according to the invention as a switch and short-circuiting device in two levels;

FIG. 13 shows a schematic diagram of the embodiment of the connection pieces and mating contact pieces and the power supply thereof utilizing the Lorenz force;

FIG. 14 shows an illustration of the switching device according to the invention in a cross-section with additional burn-off contacts;

FIG. 15 shows two illustrations of a further development of the switching device according to the invention in a cross-section with open (on the left) and closed (on the right) air gaps;

FIG. 16 shows a longitudinal section of an illustration of the switching device according to the invention with a recognizable hollow space for receiving an overvoltage protection element, as well as a block diagram of the electrical incorporation of this overvoltage protection element; and FIGS. 17 and 18 show another longitudinal section of an embodiment of the switching device according to the invention with a hollow space for receiving a fuse and, on the right (FIG. 18), detailed illustrations of the contact arrangement for the electrical incorporation of the fuse;

FIG. 19 shows a schematic diagram of a single-pole hybrid switching device with double interruption and support by a semiconductor switch, which is connected to the co-rotating contact pin, with a semiconductor switching element, e.g. IGBT 25;

FIG. 20 shows a single-pole hybrid switching device with a quad-interruption and support by a semiconductor switch above one of the double interruptions;

FIG. 21 shows a schematic diagram of a two-pole interruption in the longitudinal direction, wherein one pole performs the power-switching and is hybrid-supported by a semiconductor switch with a second pole which disconnects nearly without power;

FIG. 22 shows a schematic diagram of a two-pole interruption in a longitudinal direction with a short-circuiting switch in the shunt branch, each hybrid-supported by a semiconductor switch;

FIG. 23 shows a schematic diagram of a single-pole interruption lengthwise with a short circuit in the shunt branch, wherein the short circuit support is accomplished by a semiconductor switch triggered by an interruption device;

FIG. 24 shows a schematic diagram of a two-pole interruption in the series branch and short circuit in the shunt branch, with short circuit support by a semiconductor switch triggered, again, by an interruption device; and FIG. 25 shows a schematic diagram of a single-pole double interruption in the series branch with a short-circuit support in the shunt branch by a semiconductor switch.

The switching, in particular the switching off, and the behavior of arcs in direct current circuits of photovoltaic systems differs significantly from that in direct current circuits with a linear two-pole characteristic (accumulators, batteries, rectifier systems or DC generators as sources) or that in alternating current circuits.

Figure 1:
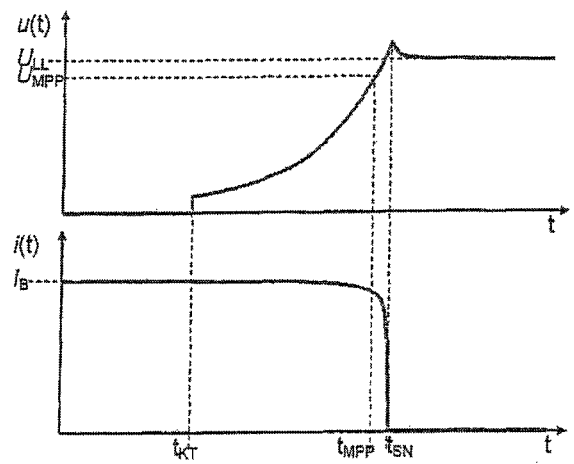
FIGS. 1 and 2 show voltage-current characteristics upon switching different sources.
Figure 2:
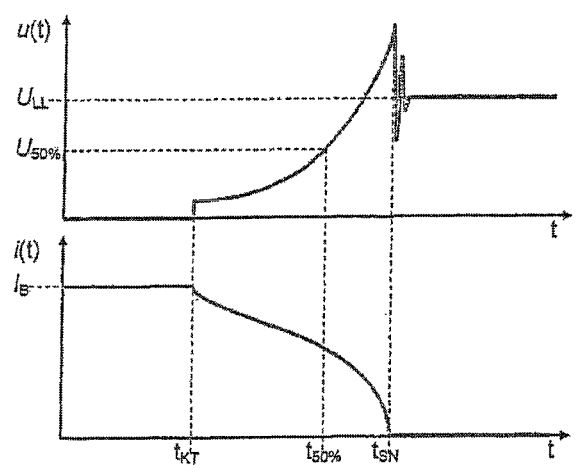

The special feature of solar generators is the property to act by approximation as a constant current source with a high internal resistance, which stands for favorable existence conditions and, thus, high stability for arc faults as well as switch arcs. This is expressed by the non-linear voltage-current characteristic, which is relevant for switching off DC currents in PV systems. On photovoltaic sources a nearly constant current occurs upon switching off, until the arc voltage ($U_{LB}$) has become greater than, for instance, the voltage at the point of maximum power ($U_{MPP}$) (FIG. 1). Thus, the arc becomes unstable only and the current is reduced when an arc voltage of greater 70% to 90% of the open-circuit voltage ($U_{LL}$) of the solar generator has been built up in the switching device. As opposed to that, a reduction of the current in circuits with linear two-pole sources already occurs immediately after the arc formation, and the arc already becomes unstable at an arc voltage ($U_{50\%}$) greater 50% of the driving source voltage ($U_{LL}$) (FIG. 2).

By comparison, in circuits having photovoltaic sources the switching and arcing times are, in general, long. As a consequence, and boosted by the high constant current for a long time, a high degree of switching operations at nominal power of a switching device is necessary. A high degree of switching operations usually implies a high thermal stress imposed on the switching apparatus as well as an increased burn-off of switching contacts and extinction devices, associated with accelerated aging.

Below, a switching device according to an exemplary embodiment will be described, which is designed especially for the above-mentioned demands in the DC part of photovoltaic systems and does not exhibit the aforementioned drawbacks. In the very simply designed switching device the switching off is realized by means of a rotary motion (FIG. 3, FIG. 4). A double interruption without an extinction chamber and a narrow gap around an insulating material cylinder, which rotates in the bore of an insulating material block, have a strong influence on the arc voltage and finally cause the extinction of the break arc. With one pole having only two points of interruption the current is interrupted also at high direct voltages. Thus, no interconnection of poles is necessary and a very compact configuration is obtained. The interconnection expenditure in and at the switching device is small. As only an almost direct current path is provided in the switching device an unfavorable mutual influencing of current paths is out of the question. Moreover, owing to the small number of components, in particular mobile parts, the susceptibility to faults is only small.

The structure of the switching device in its basic configuration is shown in the graphics according to FIG. 3 and FIG. 4.

FIG. 3 shows a top view of a section through the switching device and FIG. 4 a side view of a section. In both figures the switching device is in the On-state (current path closed).

A rotary cylinder 2, which is made of a gas-emitting plastic material at least on its circumference, is surrounded by a cylinder receptacle 1, with a hole which may be configured as a through bore or bore of a certain depth. Between the inner wall of the hole of the cylinder receptacle 1, again made of a gas-emitting plastic material at least on its inner circumference, and the cylinder 2 inserted into the cylinder receptacle 1 an air gap of a small defined width is provided. The gap width was chosen to achieve an optimum with regard to influencing the arc, which requires a small gap width, with regard to the rotating speed, respectively the friction of the rotary cylinder 2, and the temperature-dependent longitudinal and volume expansions which require a greater gap width.

A suited gap width was determined in test series, which is smaller than 200 μm, preferably between 50 and 100 μm. At the same time, the possible deposit of burn-off products and the discharge of extinction gas was additionally taken into account. In the middle of the rotary cylinder 2 and at a right angle to the axis of rotation a through-pin 3 is arranged in a through bore and has a co-rotating contact piece 4 (on the inside) on each end face. As described, the rotary cylinder and the cylinder receptacle may be made, partially or completely, of a gas-emitting plastic material. Also, it is conceivable that the aforementioned parts are made from a combination of burn-off-proof and gas-emitting material, or only of a burn-off-proof, partially gas-emitting material, respectively only gas-emitting plastic material. Thus, the desired defined gap width is largely preserved during the operating period of the switching device.

The length of the through-pin 3 including the contact pieces 4 is equal to the outer diameter, or smaller than the outer diameter of the rotary cylinder 2 by 100 to 200 μm. In the wall of the cylinder receptacle 1 two circular openings are provided opposite each other and at a right angle to the axis of the bore for the stationary contact pieces 5 (on the outside) to penetrate therethrough. At the ends of spring elements 6, which are preferably realized as leaf springs, the stationary contact pieces 5 (on the outside) and the holders for the lift-off elements 9 are mounted.

Owing to a defined spring force of some Newton the stationary contact pieces 5 (on the outside) having a circular cross-section exert a pressure onto the co-rotating contact pins 4 (on the inside), which likewise have a circular cross-section, thus ensuring the current flow in the On-state. This is feasible because the contacting or lift-off elements 9 are placed above the engagement surfaces 17 which are incorporated in the circumferential surface of the rotary cylinder 2 in the surroundings of the through bore for the through-pin 3 with the co-rotating contact pieces 4.

The power supply to the contact pieces 5 is realized by the connection terminals 8 and the preferably angular connection pieces 7. As far as the respectively used material having a specific conductivity is concerned the connection pieces 7 as well as the spring elements 6 have a sufficient cross-section to carry continuous and pulsed currents. Thus, a sufficient mechanical strength for pulsed currents and a minimum temperature rise for continuous currents (nominal, respectively overcurrent of the switching device) are obtained. One connection piece 7 each, together with a spring element 6, is rigidly fixed to the cylinder receptacle 1 on opposite sides. On the rotary cylinder 2 it is centrically possible at one end face that the rotary motion of the drive 10 can be transmitted to the rotary cylinder 2 without a significant power loss and rotational travel lag. The rotary drive 10 is rigidly connected to the cylinder receptacle 1 so that a rotation of the rotary cylinder 2 occurs as a relative motion with respect to the cylinder receptacle 1. FIG. 5 illustrates a top view of the section during the switching off operation with a break arc being present.

The Off-state (current path opened) of the switching device is shown in FIG. 6, viz. a side view of a section. FIG. 7 shows a top view of a section.

The switching off operation can be described by means of FIG. 3 to FIG. 7. The configuration of the interruption points, respectively switching contacts as well as the design of the cylindrical rotary arrangement entail that the arcs produced upon contact separation are immediately located in the narrow gap and, thus, are influenced immediately after their formation. This requires a fast increase of the arc voltage. Due to the simultaneous, fast extension and influencing of two arcs the double interruption in the switching device effects a short arc period and a small energetic load on the switching device. Moreover, the contact elements, which are connected to the terminals leading to the outside, can be configured such that only a small motion (<0.5 mm) becomes necessary.

Due to the rotary motion and the interrupter configuration the co-rotating contact pieces 4 and the fixed contact pieces are stressed by the arc only at their edges and damaged there during the switching operation. The central area of the contact pieces, across which the continuous current flows in the closed state of the switching device, does not experience any considerable stress caused by the arc. Thus, a low contact resistance is preserved, and the losses and temperature rise are reduced.

If, driven by the rotary drive 10, the rotary motion of the rotary cylinder 2 commences, the co-rotating contact pieces 4 (on the inside) still slide along on the fixed contact pieces 5 (on the outside) up to a small angle of rotation until the contact pieces are each separated on opposite sides. This separation produces two arcs, which change into a stable burning state only within some 100 μs. During this time the rotary motion is continued at a high rotating speed and both arcs are extended and immediately drawn into the narrow gap between the hole in the cylinder receptacle 1 and the rotary cylinder 2, with the result that the arcs have to adopt a very flat, wide cross-section. At the same time, the high temperature of the arcs acts on the insulating material surfaces of the rotary cylinder 2 and the inner wall of the cylinder receptacle 1, and the strongly gas-emitting insulating material starts to decompose at the surface thereof. Immediately after the contact separation the lift-off elements 9 move away from the engagement surfaces 17 and then slide along on the rounded rotary cylinder surface so that the contact pieces are located some 100 μm above the rotary cylinder surface for the further rotary motion. As the contact pieces cannot touch the cylinder surface it is impossible for (molten) contact material to settle on the surface by friction, which would reduce the spark-over stability.

By constricting the arcs in the gap and by the gas development the pressure is increased, so that the arc field strength strongly increases. Moreover, the tight contact of the arcs with the insulating material surfaces brings about a cooling of the arcs, which likewise contributes to an increase of the arc field strength.

Together with the extension of the arcs the pressure increase and the cooling entail a rapid increase of the arc voltage (s. FIG. 1). Already after a few degrees of the rotation of the cylinder 2, which corresponds to a duration, for instance, of 1 to 3 ms, and with high electrical parameters (1500 V, 100 A) of the present direct current PV circuit, thus a total arc voltage is built up in the switching device which is in the amount of the driving source voltage (open-circuit voltage). Thus, the current is rapidly brought to zero, and the DC circuit is interrupted. Especially due to the extinction gas of the insulating material still being present after the zero current, and the discharge thereof from the previous arc area, both contact break distances are rapidly deionized, the contact break distances are rapidly reconsolidated, and a safe isolating gap is built up by the switching device.

If the electrical parameters of the direct current PV circuit, in which a switching off is to take place, are smaller than the nominal values of the switching device the arc extinction already occurs after a shorter rotation distance and, thus, after a shorter arc period, and the amount of insulating material transformed to gas is reduced. Clearly smaller electrical parameters than the nominal values even result in an extinction of the arcs during their phase of stabilization. In this case, the arc duration is only maximally 1 ms.

One advantage of the described switching device to be emphasized is that, prior to the extinction in a switching off operation, the arc does generally not reach the thermal equilibrium. Depending on the switching current and the switching voltage one can say that only an electric spark occurs, instead of a stable arc. As compared to known switching devices, in which normally thermally stable arcs have to be extinguished, the efforts to be made in the switching device for interrupting the current are comparatively small.

Despite the emission of gas when the arc acts on the insulating material no massive, directed gas flow occurs because the gas formation and the pressure increase associated therewith occur only for a short period. Therefore, no hot gas flows out of the arc space, so that gas channels and the cooling (respectively deionizing) of hot gas are not necessary.

The arc drawn in the switching device proposed can hardly be affected in respect of its motion, its shape and its length by external influences, such as electromagnetic forces induced by current loops or permanent magnets. The arc space, respectively arc path are predefined by the internal structure of the switching device, so that the arc does not have enough space to find shorter distances or increase its cross-section. Thus, the switching device has a reproducible switching and arc behavior, i.e. with a given switching voltage and a given switching current the arc periods and arc energies occurring upon multiple switching off actions are subject to a small leakage.

The arc extinction is substantially supported by the gas emitted from the insulating material. To this end, an insulating material is to be used which already emits sufficient amounts of suited gases at low temperatures, i.e. already when the arc initially occurs. The gas emission must not be accompanied by the formation of conductive decomposition products or conductive layers (sooting, electric strength, isolating gap) or lead to the formation of roughened insulating material surfaces (deceleration of the rotary motion). The plastic material polyoxymethylene (POM) was found to be particularly suited, which has a good cooling effect on the arcs and effects the bonding of carbon by released hydrogen and oxygen. This plastic material furthermore has good lubricating properties, and a smooth surface is preserved upon the action of the arc.

A gas emission from the insulating material upon the action of an arc means the burn-off of insulating material and thus an enlargement of the narrow gap. The burn-off starts in the front area of the available rotation distance and continues with the number of switched off loads on the circumference of the rotary cylinder and the inner wall of the bore in the insulating material block. As frequent switching operations are not required in the proposed use of the switching device in photovoltaic systems the burn-off does not constitute a disadvantage. If the burn-off is disadvantageous for certain switching tasks it is possible to use a different insulating material or a material combination resulting in less burn-off upon the action of an arc.

To allow for the greater safety requirement of photovoltaic systems it is furthermore proposed to insert a simple sensor system for monitoring the burn-off in the switching device which, upon reaching a predefined limit, inhibits the switching mechanism and indicates this state. The limit is set to a burn-off value well ahead of the end of the service life. In a simple manner, for instance, a locally defined point in the wall of the hole of the cylinder receptacle 1 may have, for this purpose, a smaller wall thickness (recognizable in FIG. 8a), which is reduced as a result of burn-off and releases a blocking element once a corresponding burn-off depth is reached. The blocking element can become active only in the Off-state, securing the rotary cylinder 2. Thus, the blocking is performed in the opened state (Off position), with the result that the switching device can no longer be closed (switched on) (FIG. 8b). Other electrical or optical methods are usable, which detect the burn-off state in terms of the remaining service life and, if necessary, trigger the blocking. The blocking is indicated on site or remotely.

The defined point in the wall of the cylinder receptacle may be arranged in the center of the height of the cylinder bore and, for instance, at ≤45° (half the rotation distance). The blocking element is released if the gap expands at this point, for instance from 0.1 mm to about 0.3 mm. To this end, the point in the wall of the cylinder receptacle has a smaller wall thickness, for instance, of 0.2 mm. As the material wear on the circumference of the bore of the cylinder receptacle and the rotary cylinder is not uniform, but decreases from 0° to 45° and more, this wall thickness at the blocking element should be chosen to be comparatively small. The material reduction at the circumference of the cylinder receptacle and the rotary cylinder may be imagined such that the air gap gets larger in a virtually wedge-shaped manner.

In the Off-state the switching device then fully satisfies the criteria of an isolating point. Devices allowing for a remote signaling of the current status of the switching device (position On, Off or blocked) may be provided.

Upon switching the switching device the direction of rotation for the switching off and switching on operation may be opposite, or a predefined direction of rotation may be maintained continuously for all switching operations. Moreover, it is possible to alter the direction of rotation after two consecutive switching operations (Off and On, or On and Off), which leads to halving the arc-induced stress on the insulating material walls at the narrow gap and, at the same time, implies a symmetrical wear of the contact pieces.

In the switching device proposed the lifting off of the outer, resiliently mounted contact pieces (mating contact pieces) from the rotating insulating material cylinder can be easily accomplished during the rotary motion so as to prevent these contact pieces from sliding on the insulating material cylinder. Thus, the formation of conductive tracks on the surface of the insulating material cylinder is avoided and a high-impedance isolating gap is ensured in the Off-state.

The lifting off is realized by fixing one or two lift-off elements made of an insulating material (plastic material) on each outer contact piece at the side, which are in permanent contact with the circumferential surface of the insulating material cylinder. Recessed engagement surfaces situated in the region of the co-rotating contact piece on the circumference of the insulating material cylinder allow the contacting. If the cylinder rotates, the lift-off elements move away from the engagement surfaces to the non-recessed circumferential surface of the insulating material cylinder, thus lifting the contact pieces.

The DC load isolating switching device as proposed can be incorporated for switching off, respectively disconnecting in the PV direct current main cable/line (on the DC side of the PV DC-AC inverter; see FIG. 9), in PV sub-generator cables/lines (multiple strings combined), or in PV string cables/lines (in or on the string). The preferential use can be seen in industrial PV systems, such as large-scale plants or PV power stations, with high nominal voltages, e.g. in the range of 600 V to 1500, and high nominal currents, typically in the range of some 10 A to a few 100 A. For those high electrical parameters the switching device is designed with a gap width of preferably smaller than 0.1 mm between the parts made of a gas-emitting insulating material, preferably polyoxymethylene (POM).

The medium circumferential speed should be more than approximately 4 m/s with a total circumferential distance of at least 20 mm, resulting by approximation in a linear increase of the arc voltage of more than 100 V/mm circumferential distance, respectively more than 400 V/ms. The switching device is primarily constructed not for frequent switching, but occasional switching, whereby the number of switching operations (switching on and off) increases at reduced voltages and currents relative to the nominal values. If a fault occurs in a photovoltaic system a short circuit of the solar generator usually produces the safest state. This also applies with regard to the safety in extinguishing fires by the emergency forces of the fire department.

One favorable embodiment of the switching device is, therefore, the combination of the circuit breaking device with a short-circuiting device for CD circuits of PV systems (according to FIG. 10).

An extension may be configured such that in the switching operation a longitudinal section is separated first (e.g. in the plus power supply line), and then a transverse section is short-circuited (e.g. between the plus and minus power supply line), whereby a direct mechanical coupling is obtained. A possible configuration is a single-level arrangement (FIG. 11) in which additional outer contact pieces are used for the short-circuiting, rotated by 90° relative to the outer contact pieces provided to realize the interruption. A two-pole or multi-pole configuration, too, with two or more levels, can be realized (FIG. 12). Both embodiments may be realized with a drive.

As the elements for the short-circuiting are designed analogously to the elements for the switching off and on, the switching device allows to undo the produced short circuit of the solar generator, for instance if the fault case is no longer applicable, and simultaneously make the current flow again to the DC-AC inverter. This corresponds to a switching off operation in the short circuit section to interrupt the short circuit current and to a switching on operation in the isolating gap. The configurations are possible with a combined switching off/switching on and short-circuiting function (3 terminals), or with a fully separated switching off/switching on and short-circuiting function (4 separate terminals). The switching device is to be connected in the solar generator such that the terminals for the short-circuiting are located on the generator side and the terminals for interrupting are located on the DC-AC inverter side (line between switching device and DC-AC inverter). Each configuration should ensure that the separation (arc extinction) is reliably completed prior to the short-circuiting as the capacitors of the DC-AC inverter can otherwise be discharged with a very high current (up to some kA for a short time) via the switch (i.e. the longitudinal arc then being present).

The current path of the short-circuiting device may be provided in the switching device with an adequately configured active resistor so as to limit the short-circuit current. In this design, the active resistor should not be flown through by the operating current of the solar generator. To this end, the through-pin 15 of FIG. 12 can preferably be made from a material which has an increased specific electrical resistance. Thus, the transient electrical transition to the short circuit is damped and the continuous short-circuiting stress, in particular for the solar modules, is reduced. The active resistor should be dimensioned such that the voltage drop upon the short-circuit current does not exceed the permissible values for the personal protection.

Pulsed currents occurring in photovoltaic systems with a rapid current increase are controlled by the switching device without entailing the lifting off of the contacts, mechanical damages or excessive thermal loads. The preferred embodiment is configured such that only two points of interruption are present per pole, minimized internal current loops are present, and correspondingly large conductor cross-sections are used. The switching device may also be configured to have several points of interruption per pole for use with higher system voltages, which results in an increase of the voltage drop, the losses and the continuous current temperature rise, however. The aforementioned minimum current loops are achieved with a conductor in the switching device that is preferably continuously straight-lined and has a minimum offset.

As, in general, no complicated external interconnection is necessary, e.g. for a serial connection of contact-break distances, no external current loops occur which would result in an increased impedance and actions of forces. On the other hand, the current in the switching device may also be carried such that (FIG. 13) the current forces acting above all upon great pulsed currents ensure an intensification of the contact force and are directed opposite to the forces lifting off the contacts so that a very high pulsed current carrying capacity is obtained. The aforementioned forces lifting off the contacts occur upon the current flow across contact pieces that contact each other in points, corresponding to the force law according to Lorentz $F=I\cdot(I\times B)$ by oppositely directed current components in the opposing contact pieces. In a physically same manner, but caused deliberately, forces in the arrangement of FIG. 13 are generated by the opposite current flow in the conductor to the contact pieces, the forces pressing the opposing contact pieces together. This current-carrying configuration means a slight increase of impedance. Substantially, only the inductance is greater which, again, mainly becomes active upon a pulsed current load. To reduce the arc effect and burn-off phenomena burn-off contacts known in the switchgear technology may be used. In a switching off operation the burn-off contacts are separated after the continuous current contacts. Thus, the arc-induced direct load on the continuous current contacts is avoided and the low-impedance current transition in the On-state is permanently guaranteed. The rotation principle of the switching device allows a particularly advantageous integration of burn-off contacts. In this design, the burn-off contacts are to be arranged in such a way that the break arc formed only upon the separation of the contacts is already located more closely to, or deeper in the insulating material gap, so that the arc extinction is accelerated (FIG. 14).

With low switching currents or low switching voltages the formation of an arc is thus prevented, respectively the extinction process is initiated already before the arc has reached its thermal equilibrium, so that the switching work performed in the switching off operation is very efficiently reduced.

In principle, the switching device can do without the wiring of the contact-break distance with active (semiconductor elements) or passive (ohmic resistors, PTC resistors, varistors, capacitors) extinction aids. However, the use of the mentioned wiring elements is additionally possible to reduce the duration and energy of the arc. An external wiring can thus contribute to the switching performance or wear reduction. In particular additional auxiliary contacts, e.g. the burn-off contacts, should be used for the connection of wiring elements. In order to maintain the separating property of the switching device the wiring should preferably be accomplished only at one point of interruption in the switching device.

The configuration of a switching device with two or more switching poles in an apparatus may be an advantage in certain cases of application. In a direct current circuit, instead of interrupting only one line (plus or minus power supply line) in a single-pole configuration, the plus and minus power supply lines may be interrupted simultaneously in a two-pole configuration.

Moreover, a series connection of a two- or multi-pole configuration allows the controlling of a higher switching off voltage, or of a higher continuous current in a parallel connection. If the switching device is designed, for instance, with a quad-interruption, realized by an adapted contact system in the insulating material parts predefined by the basic arrangement, the compact structure is preserved. A stacked arrangement of basic single-pole configurations including a drive is also possible. The installation height is then increased.

If a short circuit current detection is necessary for a special case of application same can be configured as a loss-free current detection (Rogowski coil, electro-optical) which may trigger the drive of the switching device.

In the Off-state (opened), with a high applied direct voltage, the switching device has to form a safe isolating gap. Continuous sliding distances should therefore be avoided. For this to be achieved several air gaps, which are alternately open and closed at the side, may be mounted on the circumference of the rotating insulating material cylinder (rotary cylinder 2) and on the circumference of the hole in the insulating material block (cylinder receptacle 1), which are fully developed only in the Off-state after the rotary motion is completed (FIG. 15). Open and closed at the side refers to the end faces of the rotary cylinder 2 and the cylinder receptacle 1. The open air gaps allow the discharge of possibly produced burn-off products (soot particles). The closed air gaps collect, for a short time, insulating material gas under an increased pressure, which represents an increased dielectric strength.

The rotary cylinder 2 of the switching device may also be designed as a hollow cylinder, which allows a reduction of weight and a reduction of the driving force of the switching device, or an increase of the rotational speed. On the other hand, such a hollow space 23 in the rotary cylinder 2 may also serve to accommodate elements for additional functions (FIG. 16). One possibility is here the integration of an overvoltage protection element 18 (spark gap, gas arrester, varistor) or a switching element (power semiconductor, fuse) in the rotary cylinder 2. The element additionally introduced into the rotary cylinder 2 is switched on or off by the switching motion (rotation), depending on the arrangement. As illustrated in FIG. 16 and FIG. 17 it is possible that the elements introduced into hollow space 23 of the rotary cylinder 2 are rigidly connected to same and co-rotate, or that the elements are fixed in the cylinder receptacle 1 and are, therefore, advantageously stationary in the switching device. In the latter case it is required that the electrical connection to these elements can be established through an extended contact system (driving contacts) which is formed together with the rotating hollow cylinder (FIG. 17 left, FIG. 17 right). If an overvoltage protection element is used the advantageous property of the switching device to have a high pulsed current carrying capacity is indispensable. The proposed additional switching element (semiconductor, fuse) allows a reduction of the stress on the switching device during the switching. In the On-state the current flows via the low-impedance contact system and the through-pin 3. In terms of time sequence the switching off operation is performed such that, when the switching contacts are separated without an arc, the switching current commutates to the parallel switching element (power semiconductor, fuse 24) which interrupts the current.

In this design, the additional switching element is to be inserted only at one point of interruption in the switching device. The other, serially arranged point of interruption serves to create the isolating gap. If a fuse is used, same has to be replaced after the switching off. A created hollow space 23 may also receive the devices for the detection of the burn-off state and for blocking the switching mechanism, so that space is saved with respect to the switching device as a whole.

The switching device according to the invention and the method realized by same makes use of the principle of separating contacts, whereby at least one of the contacts is movable, such that the arc is formed in a narrow gap made of a gas-emitting material or is transferred into same. The geometric arrangement proposed makes sure that at least an average voltage increase of 300 V/ms over a period of at most 4 ms can be achieved during the motion.

The embodiments according to FIGS. 19 to 25 show solution approaches for configuring the switch to realize an increased number of switching operations, with the aim to create a fully completed separating switch for operating functions. According to this solution approach, basically a gap switch is combined with electronic extinction aids in terms of a hybrid switch. According to FIG. 19 a switching device is shown, where a semiconductor switch 25 is connected in parallel to reduce the stress on the switching device. In this design, the semiconductor switch 25 is connected to only one of the two interruption points of the switching device, so that the electric isolation by the switching device is preserved, as was explained above.

The connection of the semiconductor switch 25 is accomplished, according to FIG. 19, by a main terminal of the switching device 8 and by an additional auxiliary terminal at the movable pin 3. As the semiconductor switch 25 carries a current only for a short time the auxiliary terminal may be provided with a relatively small cross-section for the connection, so that a number of possibilities in terms of a simple constructive realization are obtained. The semiconductor switch 25 is triggered when the switching device is opened. In the parallel contact-break distance an arc is prevented or extinguished. Thus, the contact-break distance is hardly stressed. After a minimum closing time of the semiconductor switch of less than some milliseconds the semiconductor interrupts the current. The arc in the switching contact without the parallel semiconductor switch is extinguished as well so that the switching operation is completed.

The electrically and magnetically controlled switching operation is, in this design, configured such that the stress on the switching contact without the parallel semiconductor switch is clearly below its switching capacity. A switching device of this type allows a significant prolongation of the service life and increased number of the electrical switching operations as compared to an embodiment without electronic support. As compared to conventional hybrid switches it is an advantage that the switch according to the invention is capable of successively interrupting the electric circuit several times, even in the event of a failure of the electronic control.

FIG. 20 shows a schematic diagram of an embodiment without the contacting of the moved contact pin 3, analogously to the design modification featuring a two-pole switching device, as is explained by means of FIG. 12 and FIG. 17.

In photovoltaic systems it is frequently common practice to interrupt both phases, meaning the plus and minus power supply lines. Also, it may be sensible to briefly close the photovoltaic generator after the interruption of the phases and disconnection of the DC-AC inverter (see FIG. 9).

The step-wise realization of the protection of this type can, of course, be achieved by separately set up switching devices with a hybrid switch and, where appropriate, with mechanically coupled releases for the interruption of the positive and negative poles, as is shown in the block diagram of FIG. 22.

Such an application-relevant solution may also be realized in a switching device having several switching poles.

In such a design, the arrangement according to FIG. 12 would be supplemented with a further level, so that only one drive is required.

Each of the switching devices of the, in that case, three levels could be provided with a contact as hybrid switch, according to FIG. 19. The contact pins 3 of the positive and negative phase level are then located on one axis and, thus, open simultaneously, while the contact pin 3 of the short-circuiting device is staggered and, thus, closes with a time shift.

In terms of time, the closing of the short-circuiting device is performed after the switching off through the hybrid switch. The hybrid switch of the short-circuiting device according to FIG. 22 is sensible for restarting the plant, i.e. the opening of the short-circuiting device.

In this case, the short-circuiting device has to switch off the short-circuit current of the photovoltaic system against the open-circuit voltage of the plant before the switches in the phases realize the connections to the DC-AC inverters (lengthwise).

In plants where the storage capacity of the DC-AC inverter is discharged after the interruption of the phases the connection of the phases may also take place earlier. On opening the short-circuiting device the capacity to be discharged virtually acts as an extinguishing aid for the short-circuiting switch.

FIG. 21 shows a simplified arrangement without a short-circuiting device and with only one hybrid switch in one phase. The other phase has, in this case, only one separating switch. This structure can be realized with a switching device having two levels according to FIG. 12, with one level including a hybrid switch according to FIG. 19.

In a system-specific complex arrangement, e.g. corresponding to the block diagram according to FIG. 22, e.g. with individual switches according to FIG. 19 or also switches having several levels and one common drive (e.g. FIG. 12) it may be sensible to use the function of the semiconductor switch jointly for several contact-break distances, by which the number of the rather cost-intensive power semiconductors can be reduced.

FIG. 23 shows an arrangement of a short-circuiting device 2 and a switch 1 in the plus power supply line, where the extinguishing operation thereof is only supported by one common semiconductor switch. This configuration is suited, for instance, for plants adopting measures against return currents from the storage capacities. In principle, such an arrangement may also be used, however, where the installation site and the impedances provided there do not allow any significant return currents.

However, such a use is also possible if the impedance in the circuit of the semiconductor switch, the short-circuiting device, respectively also the impedance of the switch arc of the switch 1 have such a high value that no increased return currents are possible.

In addition to incorporating additional impedances outside the phases, meaning in the shunt branch with the short-circuiting device and semiconductor switch, it is also possible that the semiconductor switch is only activated in switch 1 when an impedance of the switch arc, e.g. defined by the voltage, is reached, so that an overloading of the semiconductor switch is reliably avoided. Despite the required increased arc voltage the switch 1 is still sufficiently relieved because, due to the characteristic of the photovoltaic source, the major part of the switching performance is only transformed at a voltage in the range of the nominal voltage up to the switching off.

FIG. 24 shows a corresponding arrangement with interruption in both phases, i.e. in the plus and minus power supply lines.

A disadvantage for a photovoltaic system in the arrangements according to FIGS. 23 and 24, with a semiconductor switch in the shunt branch, would be the fact that the switched off semiconductor switch is not electrically isolated for normal operation if another serial isolating gap in the shunt branch is waived. Apart from the additional isolating gap in the shunt branch, e.g. according to FIG. 22, an arrangement of the semiconductor switch according to FIG. 25 is possible, too. A simple solution of this type can, of course, also be transferred to more complex arrangements, depending on the respective configuration of the plant.

LIST OF REFERENCE NUMBERS 1 cylinder receptacle
2 rotary cylinder
3 through-pin, contact pin
4 co-rotating contact piece (on the inside)
5 stationary contact piece (on the outside); mating contact piece
6 spring element
7 connection piece
8 connection terminal
9 lift-off element
10 rotary drive
11 break arc
12 common "plus" terminal on solar generator and for short circuit
13 "plus" terminal in line to DC-AC inverter
14 "minus" terminal for short circuit
15 co-rotating contact piece (on the inside) and through-pin for short circuit
16 stationary contact piece (on the outside) for short circuit
17 engagement surface
18 overvoltage protection element
19 burn-off contact
20 blocking, respectively arresting element
21 blocking indicator
22 open and closed air gaps
23 hollow space in rotary cylinder
24 fuse (melting fuse) stationary
25 semiconductor switch

The invention claimed is:

1. A single or multi-pole switching device for direct current applications, comprising at least one rotating switching element which is connected to a drive, and also comprising switching contacts, connection pieces and connection poles or connection terminals as well as a housing arrangement receiving the at least one rotating switching element, drive, switching contacts, connection pieces and connection poles or connection terminals,
wherein
a movably guided rotary cylinder having an outer surface is formed in the housing arrangement, which is located in a rotary cylinder receptacle, the movably guided rotary cylinder being movable in a rotational motion within the rotary cylinder receptacle so that the guided rotary cylinder may be situated in a plurality of rotational positions therein,
the rotary cylinder comprises at least one contact pin which passes through the rotary cylinder and has a contact piece at each end,
mating contact pieces are arranged in the rotary cylinder receptacle, which are electrically connected to the connection pieces and the connection poles or the connection terminals,
a narrow, arc-influencing air gap is present between the rotary cylinder and an inner wall of the rotary cylinder receptacle, wherein as a consequence of the rotational motion of the rotary cylinder with the contact pin the electrical connection between the contact pieces and the mating contact pieces is selectively canceled forming break arcs and the formed break arcs, subject to an extension, penetrate into the air gap and are rapidly extinguished there, wherein a blocking element is provided between the rotary cylinder and the rotary cylinder receptacle, wherein the blocking element is located in a guide formed in the rotary cylinder receptacle, wherein the guide includes an opening into the air gap that is sealed by a material forming at least a portion of the inner wall of the rotary cylinder receptacle, wherein wear on the inner wall of the rotary cylinder causes the opening to be cleared so that the blocking element is released therethrough and engages a complementary recess in the rotary cylinder so as to suppress new switching operations.

2. The single or multi-pole switching device according to claim 1,
wherein
at least parts or surface sections of the rotary cylinder and/or the rotary cylinder receptacle include areas pointing to the air gap, the areas being made of a material emitting an extinction gas.

3. The single or multi-pole switching device according to claim 2,
wherein
at least parts or surface sections of the rotary cylinder and/or the rotary cylinder receptacle are made, in their areas pointing to the air gap, of polyoxymethylene (POM).

4. The single or multi-pole switching device according to claim 1,
wherein
the mating contact pieces are subjected to a mechanical preload in the direction of the rotary cylinder.

5. The single or multi-pole switching device according to claim 1,
wherein
at least one tracing element or lift-off element is provided in an area of the mating contact pieces, which bears against the outer surface of the rotary cylinder and lifts off the mating contact pieces upon a rotary motion in an opening direction of the switching device,
wherein the tracing element(s) immerse(s) into a corresponding recess in the rotary cylinder in a closed position of the switching device.

6. The single or multi-pole switching device according to claim 1,
wherein
the contact pieces and mating contact pieces include sides and the sides of the contact pieces and mating contact pieces pointing to each other have a hemisphere shape, a mushroom head shape or a similar rounded shape.

7. The single or multi-pole switching device according to claim 1,
wherein
in a one-level or a two-level arrangement, after an opening operation of the switching device by means of a first or a second contact pin, a short-circuit function is effected, wherein additional mating contact pieces are arranged in the rotary cylinder receptacle which are electrically connected to additional connection pieces or connection poles, respectively connection terminals.

8. The single or multi-pole switching device according to claim 7,
wherein
the contact pin for the opening and closing is located in the rotary cylinder in a first level and the contact pin for the short-circuiting is located in the rotary cylinder in a second level,
wherein the contact pins are radially arranged with respect to an axis of rotation of the rotary cylinder to be radially offset relative to each other.

9. The single or multi-pole switching device according to claim 7,
wherein
the short-circuit contact pin has a resistance associated therewith.

10. The single or multi-pole switching device according to claim 1,
wherein
burn-off contacts adjacent to the mating contact pieces and/or the contact pieces are provided.

11. The single or multi-pole switching device according to claim 1,
wherein
offsets or recesses are provided in the rotary cylinder and the rotary cylinder receptacle pointing to each other, which increase creepage distances and, depending on the rotational position, define open or closed air gaps.

12. The single or multi-pole switching device according to claim 1,
wherein the single or multi-pole switching device further comprises at least one additional switching element; and
wherein the rotary cylinder has formed therein at least one cavity for receiving therein the at least one additional switching element.

13. The single or multi-pole switching device according to claim 12,
wherein
additional contact pieces and mating contact pieces are provided to electrically connect the at least one additional switching element located inside the at least one cavity.

14. A contact arrangement for a switching device according to claim 1,
wherein
the contact arrangement comprises a pair of rotationally movable contact pieces and a pair of stationary mating contact pieces, wherein surfaces of the contact pieces and mating contact pieces pointing to each other have a hemisphere shape, a mushroom head shape or a similar rounded shape, and upon a relative motion by pivoting or rotating surface sections which touch each other centrally lose contact and an arc is formed between edges moving apart from each other, which is formed in or drawn into an annular gap that is defined by geometry and motion between the contact piece and the mating contact piece.

* * * * *